US009253935B2

(12) United States Patent
Morris et al.

(10) Patent No.: US 9,253,935 B2
(45) Date of Patent: Feb. 2, 2016

(54) MICRO-INVERTER SOLAR PANEL MOUNTING

(71) Applicants: John Morris, Pflugerville, TX (US); Phillip Charles Gilchrist, Austin, TX (US)

(72) Inventors: John Morris, Pflugerville, TX (US); Phillip Charles Gilchrist, Austin, TX (US)

(73) Assignee: SunPower Corporation, San Jose, CA (US)

( * ) Notice: Subject to any disclaimer, the term of this patent is extended or adjusted under 35 U.S.C. 154(b) by 438 days.

(21) Appl. No.: 13/751,376

(22) Filed: Jan. 28, 2013

(65) Prior Publication Data

US 2014/0168927 A1    Jun. 19, 2014

Related U.S. Application Data

(60) Provisional application No. 61/737,365, filed on Dec. 14, 2012.

(51) Int. Cl.
| H05K 5/00 | (2006.01) |
| H05K 13/00 | (2006.01) |
| H02S 40/32 | (2014.01) |
| H02S 40/34 | (2014.01) |

(52) U.S. Cl.
CPC ............... *H05K 13/00* (2013.01); *H02S 40/32* (2014.12); *H02S 40/34* (2014.12); *Y10T 29/49117* (2015.01)

(58) Field of Classification Search
CPC .............................. H01L 31/048; H02S 30/10

USPC ........................................ 361/679.01–679.03
See application file for complete search history.

(56) References Cited

U.S. PATENT DOCUMENTS

| 2011/0000526 A1* | 1/2011 | West | F24J 2/5211 |
| | | | 136/251 |
| 2011/0214365 A1* | 9/2011 | Aftanas | F24J 2/5258 |
| | | | 52/173.3 |
| 2012/0152349 A1* | 6/2012 | Cao | H01L 31/048 |
| | | | 136/259 |

OTHER PUBLICATIONS

Safety and Installation Guide, AMD almaden, Changzhou Almaden Co. Ltd., Installation Brochure dated Sep. 2012.

* cited by examiner

*Primary Examiner* — Jerry Wu
(74) *Attorney, Agent, or Firm* — Grasso PLLC

(57) ABSTRACT

Processes, systems, devices, and articles of manufacture are provided. Each may include adapting micro-inverters initially configured for frame-mounting to mounting on a frameless solar panel. This securement may include using an adaptive clamp or several adaptive clamps secured to a micro-inverter or its components, and using compressive forces applied directly to the solar panel to secure the adaptive clamp and the components to the solar panel. The clamps can also include compressive spacers and safeties for managing the compressive forces exerted on the solar panels. Friction zones may also be used for managing slipping between the clamp and the solar panel during or after installation. Adjustments to the clamps may be carried out through various means and by changing the physical size of the clamps themselves.

16 Claims, 15 Drawing Sheets

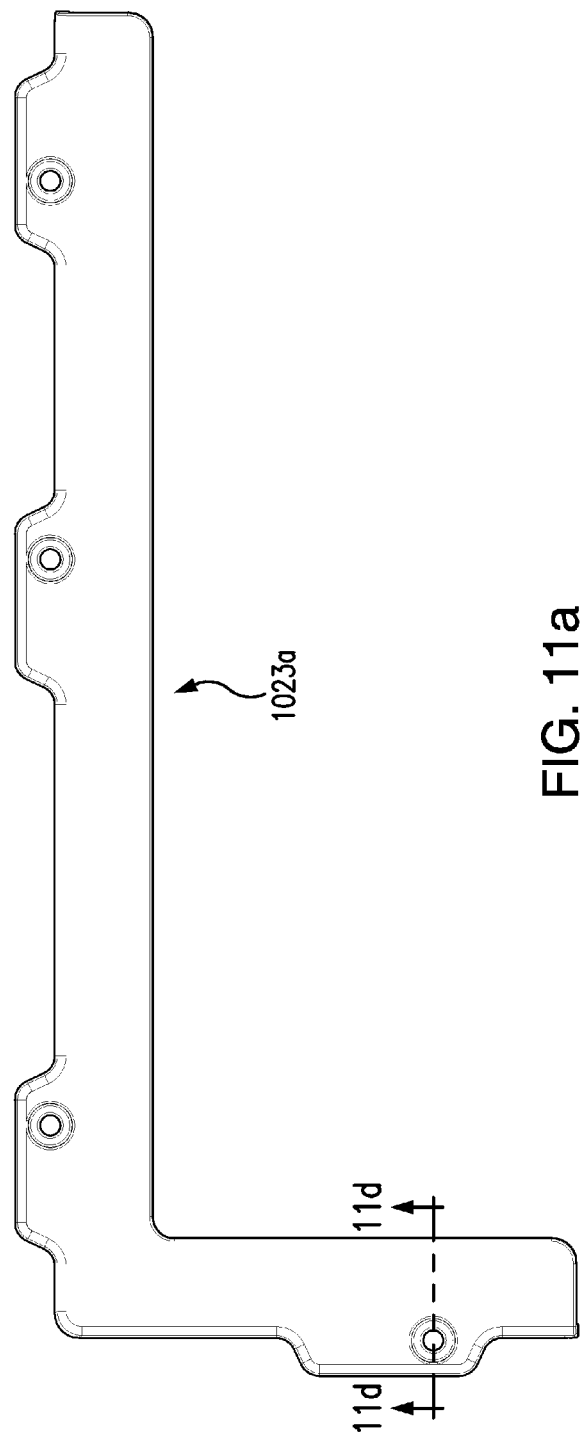
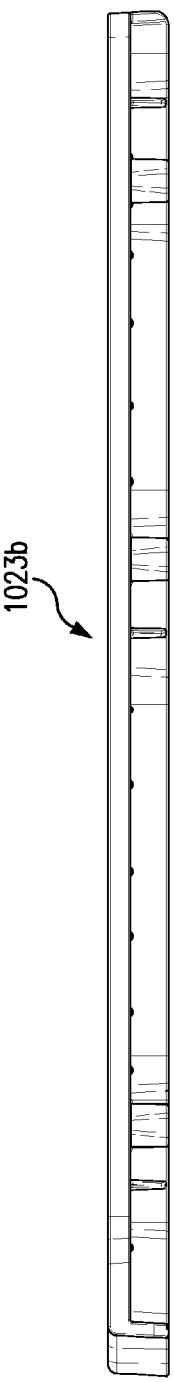
FIG. 11a
FIG. 11b

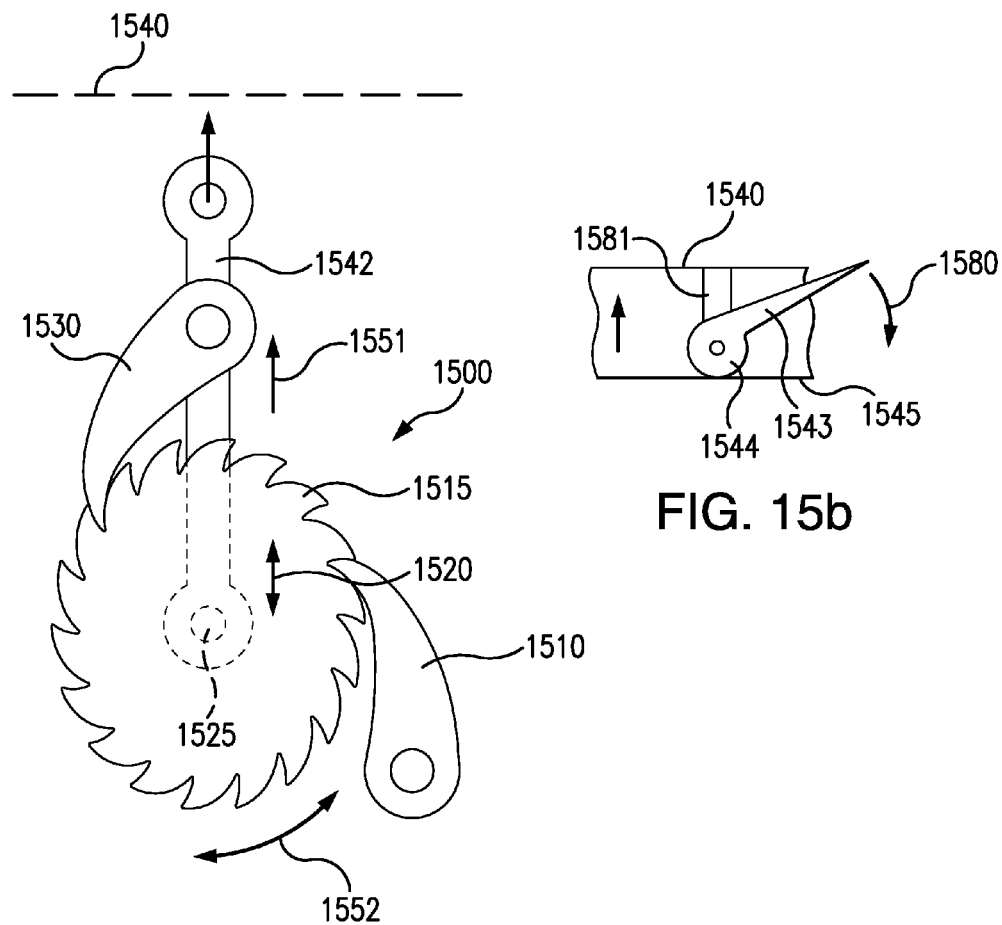
FIG. 15a
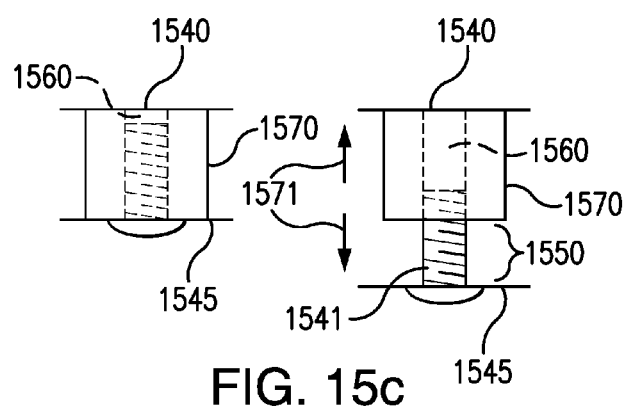
FIG. 15b
FIG. 15c

MICRO-INVERTER SOLAR PANEL MOUNTING

The present application claims priority to U.S. provisional application No.: 61/737,365, filed on Dec. 14, 2012, which is herein incorporated by reference in its entirety.

U.S. GOVERNMENT RIGHTS

This invention was made with Government support under Contract No. DE-EE0005341.001 awarded by the Department of Energy (DOE). The Government has certain rights in this invention.

BACKGROUND

The present invention relates to securing electronic components to solar arrays and more specifically, to processes, machines, and articles of manufacture for mounting micro-inverters to solar arrays without the necessity to secure the micro-inverter or one or more of its components to a frame surrounding the solar array.

Solar array panels are installed in sets to gather and convert electromagnetic light waves into direct electrical current. The direct current may be further converted to alternating current or otherwise conditioned using inverters. A single inverter may serve an entire set of solar panels converting or conditioning the power received from the set of solar array panels.

More recently, individual inverters have been paired with individual solar panels to convert or condition the direct current generated by individual panels. The fragile nature of solar panels, and the photovoltaic collectors positioned on their face, has promoted numerous protection mechanisms, including the use of transparent covering materials and full-frame cases, to protect the solar panels, and to promote their longevity.

BRIEF SUMMARY

Processes, machines, devices and articles of manufacture are provided for mounting or otherwise securing inverters, micro-inverters, or other electronic components to a solar panel with limited or no assistance from a frame surrounding or supporting the solar panel. These embodiments may include using clamps that use friction, compressive forces, or both to secure an inverter, micro-inverter, or other electronic component to a solar panel. These clamps may be positioned along an edge of the solar panel and may not interfere with or may mildly interfere with the light gathering efficiency of the solar panel or the individual photovoltaic collectors on the face of the panel. The clamps may be configured to use reactionary forces generated between the clamps and the electronic component to secure the clamp and the electronic component to a frameless portion of a solar panel.

Embodiments may include clamps such as: brackets, mountings, clips, or the like, that are sized or configured to convert frame-mounted electronics for a solar panel into a frameless mounting configuration. These clamps may include compression zones or areas that exert securing forces against the solar panel as well as safeties that provide alerts when compressive forces may be reaching tolerance thresholds of the solar panel materials. The clamps may also include friction zones or areas that retard travel, slipping or other movement between the mounted components and a solar panel during installation, as well as after installation, of the components to the solar panel.

Process embodiments can include configuring one or more clamps to bridge and allow an inverter or other component originally manufactured to be frame-mounted on a solar panel frame, to be mounted on a solar panel without a frame, or at least to be mounted on a portion of the solar panel without the use or necessity of a frame. This process may include measuring the existing micro-inverter and solar panel layouts and any fastening points they may already have or are intended to have, and constructing one or more clamps that can secure to both the assembly or its components (with or without using the fastening points) and the solar panel, and also serve to accommodate the differences between both. These differences may include size differences, securement point differences, and material tolerance differences.

These clamps may include a friction area for providing friction securement forces as well as a compression area for providing compression securement forces, and may also include a safety to provide alerts, mechanical protections, or otherwise serve to decrease or prevent the application of compressive forces greater than compressive force tolerances of a solar panel or a specific securement area on the solar panel. The compression zone and friction area may have or provide for uniform pressure and friction applied by them to the solar panel and may have or provide for non-uniform pressure and friction applied by them to the solar panel. The uniform or non-uniform pressure and friction may be applied at various spacings, both uniform and non-uniform, in the areas of the solar panel acted on by the clamps.

Clamp embodiments may comprise plastics, such as a resin, rubbers, metals and metal alloys, and may have various configurations, including rectangular shapes and "L" shapes. The clamps may generate compressive forces or other securement forces onto a solar panel by being secured to fastening points of a micro-inverter or a component of a micro-inverter assembly, and by providing for a space between itself and the micro-inverter or assembly in which the solar panel may fit. As this space changes, e.g. becomes closer, compressive securement forces can be generated to secure the micro-inverter or assembly component directly to a portion of the solar panel and without the necessity of a frame.

BRIEF DESCRIPTION OF THE SEVERAL VIEWS OF THE DRAWINGS

FIGS. 11a-11g shows top, bottom, and side views of the primary clamp from FIG. 10a.

FIG. 15a-15c show means for generating or exerting securing forces in accord with embodiments.

DETAILED DESCRIPTION

Figure 1:
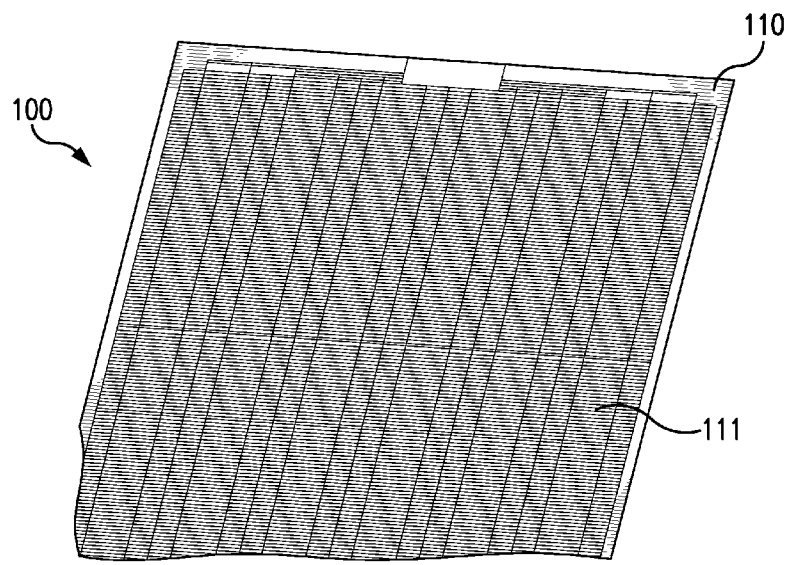
FIG. 1 shows a perspective view of a frameless solar panel for use in embodiments.

Processes, apparatus, systems and articles of manufacture are provided. These may include various processes, apparatus, and articles of manufacture for mounting micro-inverters to solar panels. Edges or other portions of these solar panels may be frameless. These edges, or other portions of the solar panels, may receive a clamp for securing a micro-inverter or other associated cabling or junction box, to the solar panel. In certain embodiments, one or more edges of the solar panel may lack a frame for mounting electronics directly to the frame and indirectly to the solar panel. These frameless mounting areas may be used by clamps or other securements to secure micro-inverters and their associated components and cabling to the solar panel.

In embodiments, existing configurations of frame-mounted micro-inverters and associated components and cabling may be used with adaptive clamps configured to pair with the micro-inverter and its associated components and cabling, and adaptively secure them to a solar panel without, necessarily, the use of a frame for which the existing frame-mounted micro-inverter and associated components and cabling were configured for.

In preferred embodiments the micro-inverter and some or all of its components will be mounted on the back, shade-side of the solar panel. However, certain components may be mounted on each side of the solar panel in certain configurations. These multi-side mounting systems may be preferred to reduce torsional forces on the solar panel. In other words, in certain installations, a micro-inverter may be mounted on the back of the solar panel while some connected components, and perhaps the cabling as well, may be mounted on the front of the solar panel.

In embodiments, a micro-inverter and its associated cabling, and components, such as a junction box, already configured for mounting to a framed solar panel, may be mounted to a frameless solar panel using a primary L shape clamp in a corner of a frameless solar panel, a mid-cable junction clamp along an edge of the solar panel, and a tertiary clamp near an opposite end of the solar panel. These clamps may be made of metal, plastic, polymers, rubber, resin, and combinations thereof, and may create securing forces through friction or compression or adhesion and various combinations thereof, between, for example, the clamp and the micro-inverter or other component. The frictional forces may be created using rubber, EPDM, or other material with surface friction properties. The compressive forces may be created by using moveable fasteners, such as screws, springs, ratchets, pawls, and levels. Adhesional forces may also be created using adhesives or other bonding agents to bond the micro-inverter and its components and cabling to a clamp and also for bonding the clamps to a solar panel. Thus, in embodiments, frictional, compressive, and adhesional forces may all work together to secure a micro-inverter and its components and cabling to a solar panel.

The clamps may extend along edges of frameless solar panels and may be sized to fit over the front face and the rear face of the solar panel, and then be secured further around the solar panel. The solar panel in embodiments may be comprised of, for example, glass, ceramic, or other brittle material. In preferred embodiments, penetration of the solar panel need not be performed by the clamp to secure the micro-inverter assembly to a solar panel. However, drilling through or otherwise penetrating the solar panel may be employed in methods, devices, and system embodiments as part of securement, or for other reasons as well. For example, cotter pins may extend through the clamps and the solar panel for initial orientation during installation and may be used for final securement also. In preferred embodiments, any penetrations through the solar panel will avoid the solar photovoltaic collectors on the face of the solar panel. In preferred embodiments, no penetrations are made in the solar panels, however in certain embodiments penetrations may be made or may exist in the panel and may be used for securement.

In embodiments, a micro-inverter main assembly may be secured in a corner of a solar panel, as noted above, or along other portions of the panel as well. This may include edges of the panel, and areas away from the edges of the panel too. In embodiments, cabling may be mounted on the same side of the solar panel as the micro-inverter main assembly and along an edge of the solar panel while, preferably, limiting or not extending cabling or components or clamps into the light receiving areas of the solar panel photovoltaic collectors.

In embodiments, clamps used for mounting cabling or junction boxes to the solar panel may be similar to those used for mounting a micro-inverter itself. These cabling and junction box clamps may be edge mounted along a solar panel, and may preferably be positioned on the same side of the solar panel as the micro-inverter. Other configurations are also possible.

Figure 6:
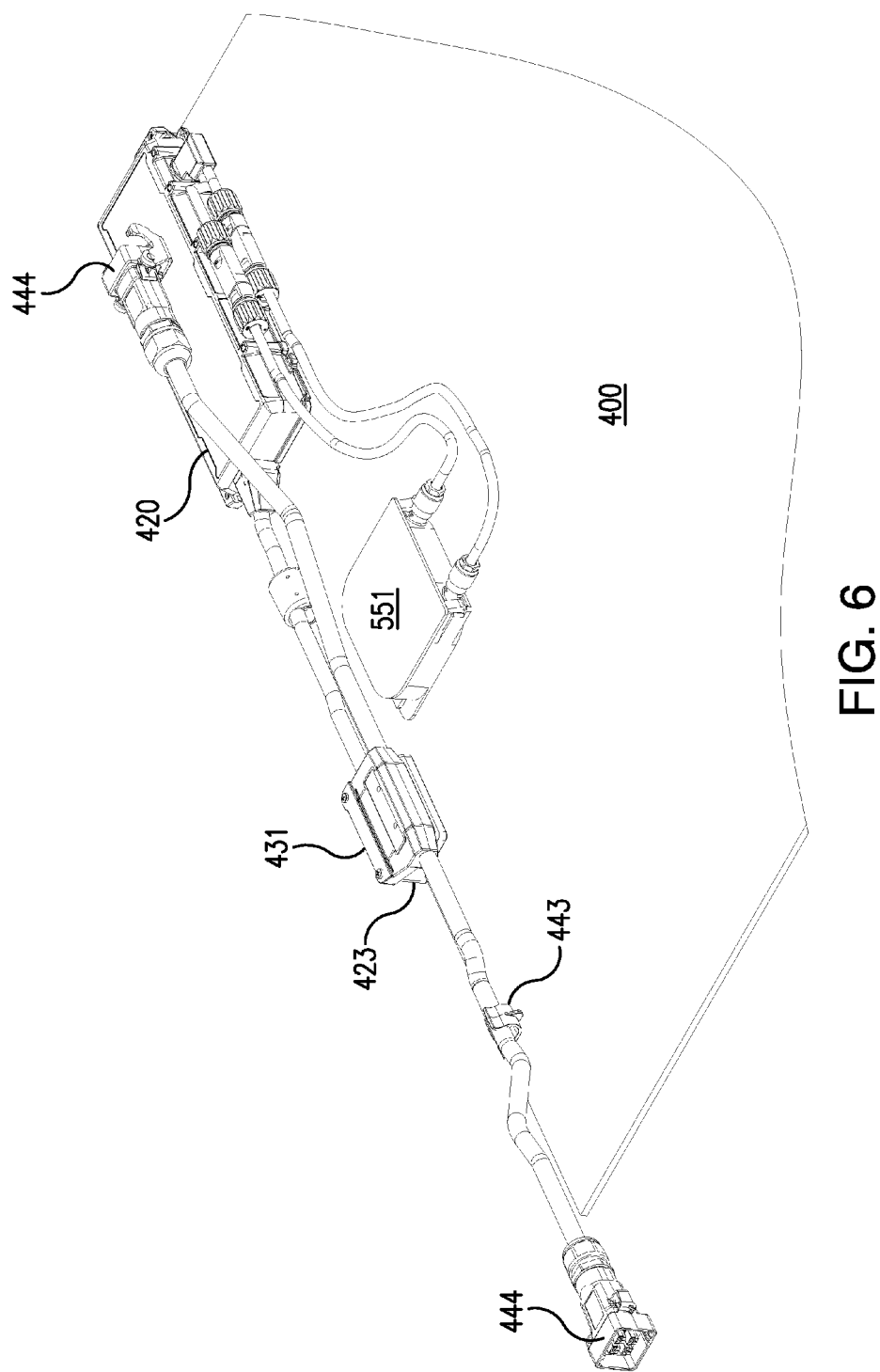
FIG. 6 shows a perspective sectional back view of the frameless solar panel with the micro-inverter assembly of FIG. 4 mounted in accord with embodiments.

As a non-limiting example, cabling or junction boxes may be mounted on the opposite side of the solar panel from the micro-inverter and the cabling and micro-inverter may be mounted on various portions of the panel—not only the edges or corners of the panel. FIG. 6 shows how the junction box 551, and micro-inverter 420, may be mounted on the same side of the solar panel—the back of the panel—and the cabling may be mounted along an edge and extendable over the side and past the side of the solar panel.

The clamps preferably may employ compression zones and friction zones to secure themselves to the solar panel. The compression zones may include the use of rubber, silicone, felt, plastomers, or other flexible and compressive materials, preferably with an elasticity greater than the material comprising the solar panel. The elastic material may preferably be configured such that an installer can readily recognize when adequate compressive forces are being exerted to secure the clamp, while remaining under the tolerances of the solar panel materials to which the clamp is applying securement forces. This configuration can include deflection zones that compress to touch the panel under certain compressive forces as well as safeties that click or otherwise provide audible or visual warnings that certain compressive forces have been reached.

The friction zones may also employ rubber, silicone, and other materials. These materials may be selected because of the frictional resistance forces they can exert to prevent sliding and movement when compressive forces are low, as during assembly, or when material tolerances prevent larger compressive forces from being exerted on the solar panel.

In embodiments, the mounting process preferably may include first securing the clamps to the micro-inverter or other component to be mounted, sliding the clamp over the solar panel, and then applying any additional compressive forces to hold the clamp and micro-inverter or its components or cabling in place. In so doing, retrofits of existing micro-inverters may be accommodated and accomplished. In other embodiments, the mounting process may be carried out in a different order, such as mounting the clamps to the solar panel first, then securing the micro-inverter or other component or cabling to the clamp.

As is shown in subsequent figures, the clamp maybe secured to the solar panel through pairs of fasteners. Thus, in embodiments, a primary clamp may be secured to a micro-inverter, the combined clamp and micro-inverter may be slid over an edge of the solar panel until the components reach their final deployed position, and the fasteners may be tightened further to clamp the micro-inverter to the solar panel. The primary clamp may be metallic as well as polymeric and may be specially configured to remain clear of solar photovoltaic collectors on the face of the solar panel.

The mounting provided herein may result in the micro-inverter being flush with a surface of the solar-panel or being spaced away from the solar panel. Moreover, the clamp and mounting locations may be adjusted to accommodate various solar panel designs and installation configurations, including installation configurations confronted in the field.

FIG. 1 shows a perspective view of a frameless solar panel 100 as may be employed in embodiments. As can be seen, photovoltaic collectors 111 and a panel edge 110 are shown. As can also be seen, the solar panel 100 lacks a frame along at least three of its edges. Thus, in embodiments, a solar panel without a frame or other external metallic mounting system may, nevertheless, receive micro-inverters or supporting components or cabling, even micro-inverters or components configured to be frame-mounted, despite the absence of a frame or other metallic external mounting apparatus for these panels.

Figure 2:
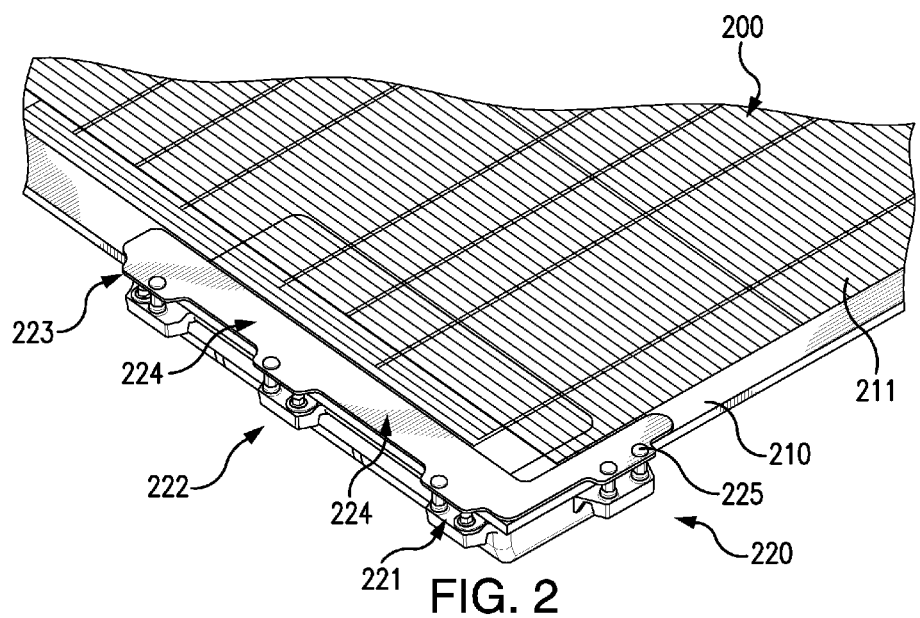
FIG. 2 shows an enlarged perspective view of a portion of a frameless solar panel having a primary clamp fastened to a micro-inverter and together serving to secure themselves to the solar panel in accord with embodiments.

FIG. 2 shows an enlarged perspective view of a corner of a frameless solar panel 200. FIG. 2 also shows panel photovoltaic collectors 211, panel edge 210, micro-inverter 220, fastening points 221, securement area 222, compression zone 224, and primary L clamp face 223. As can be seen in FIG. 2, the clamp face 223 is L-shaped and includes four securement areas 222 along its edge. The clamp also includes a compression spacer behind L clamp face (and therefore not visible in this view). The micro-inverter 220 is also visible through the solar panel 200. As can also be seen, the L-shaped clamp face 223 is sized and shaped to fit within the panel edge 210 on the light receiving side of the panel and the securement areas 222 coincide with fastening points 221 on the micro-inverter 220. This panel edge lacks the panel light collectors 211. Thus, in preferred embodiments, the clamp used for securing the micro-inverter or other components to the frameless solar panel 200 may not cover the active light collectors of the solar panel 200. However, in other embodiments, the clamp used for securing the micro-inverter or other components to the frameless solar panel may cover the active light collectors of the solar panel, such as where the panel comprises light collectors nearer or at its edge.

The clamp face 223 includes securing areas 222, each with two screws and biasing springs. The position of the securing areas 222 as well as the screws and their sizing may coincide with existing fastening points of the micro-inverter 220. During installation, to properly manage securing forces exerted by the clamp as the screws 225 are turned, an audible or visual compression safety may also be used to signal when a certain compressive force has been reached and is being exerted. This safety may be sized and designed such that notice will be provided to an installer when compressive forces being exerted by the screws 225 begins to reach the compressive force tolerance of the materials comprising the panel edge 210. In other words, as an installer is applying compressive forces through the screws 225 in the securing area 222, and is receiving compressive feedback, through springs in that area as well, an additional audible or visual compression safety may be present to sound a click, squeal, flash, color change, or other audible or visual alarm that proper compressive forces are being exerted or that limits for the panel, or panel edge, are being approached. This safety may be located in the securement area as well as in other areas of the clamp, such as in the compression spacer behind the L-shaped clamp face 223.

Figure 3:
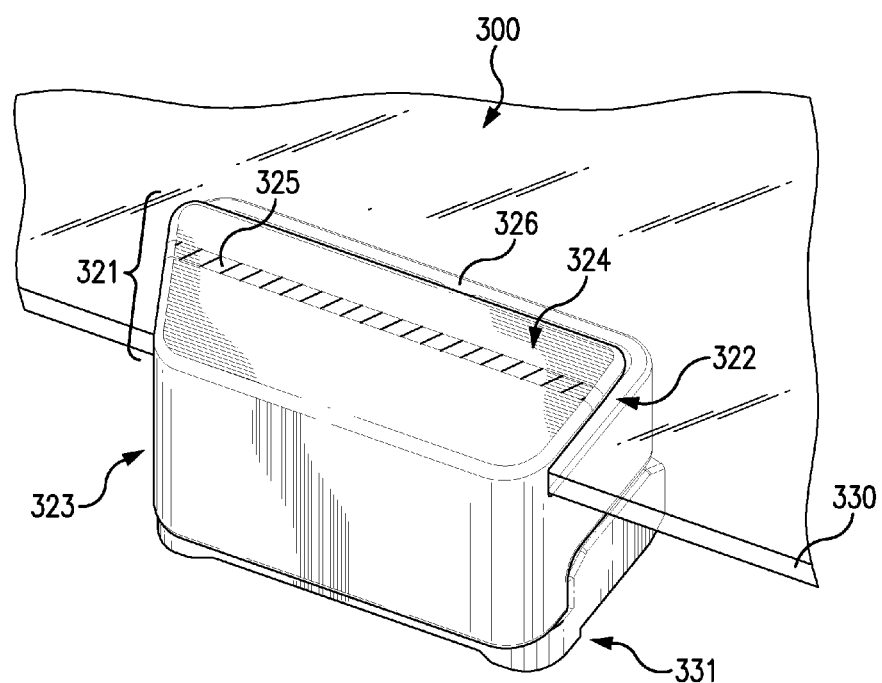
FIG. 3 shows a perspective view of a mid-cable junction clamp and mid-cable junction secured to an edge of a frameless solar panel in accord with embodiments.

FIG. 3 shows a perspective view of the mid-cable junction clamp 323 used for mounting a micro-inverter mid-cable junction onto an edge of the frameless solar panel 300. Also visible in FIG. 3 is the panel thickness 330, the clamping force 322 exerted by the face of the mid-cable junction clamp 323 on the solar panel, exposed orientation lip 326, compression zone 324, friction zone or friction strip 325, and securing area 321.

In embodiments, the clamping force being exerted by the clamp face on the panel may be exerted by internal springs as well as by screws, pins, a gear and ratchet system, a cam and lever, or other mechanical securing devices used by an installer during installation. These various systems may also provide for adjustment such that various forces may be exerted by a clamp on the solar panel. The size of the securing area 321 is preferably sized to keep stresses on the edge of the frameless solar panel 300 exerted by the clamp to be well within the solar panel's compressive stress limits.

The clamp 323 may include an exposed lip 326, which can serve to assist during alignment and orientation of assembly as well as serve to control the size of the securement area. The securement area 321 may not receive opposing compressive forces from below the area in which the lip 326 is present because an equal opposing force is not created there by the clamp. The friction strip 325, which is present in the securement area of the clamp, may be oriented in different directions as well, and there may be other friction strips as well to provide resistance to slipping forces along multiple axes.

In operation, the mid-cable clamp 323 may be secured to the mid-cable junction 331 and may preferably have an adjustable receiving space larger than the panel thickness 330. This receiving space may be adjusted using various means for exerting securing forces described herein, including a cam and lever, a ratchet, and pins, examples of which are provided in FIGS. 15a-15c. In use, the receiving space may slide over the panel 300 prior to securing the clamp to the panel. Compressive forces may then be exerted through various methodologies to compress the receiving space over and to the solar panel. As noted, the structures for creating the compressive forces can include, but are not limited to, an internal ratchet or pawl or cam system, as well as springs, and externally accessible screws.

In embodiments, the mid-cable junction clamp may also first be attached to the solar panel prior to the micro-inverter mid-cable junction 331 being attached to the clamp. In embodiments, the mid-cable clamp 323 may also first be secured to the micro-inverter mid-cable junction 331 and then the entire assembly may be secured by three clamps (a primary clamp, a mid-cable clamp, and a tertiary clamp) to the frameless solar panel 300. The mid-cable clamp 323 may also be held in place by frictional forces created by a friction strip or friction zone 325 as the compressive forces are applied and the securement is made.

The mid-cable junction clamp 323 shown in FIG. 3 may comprise a polymer material, but other materials may be used as well. In embodiments, composite materials including polymers, metals and metal alloys may be used, and these may be combined with other materials as well. Thus, the base of the mid-cable junction clamp may be a metal alloy, where it is secured to the mid-cable junction and the top of the mid-cable junction clamp may be a polymer and a rubber, where the mid-cable junction clamp receives and secures the solar panel 300.

The size of the securement area 321 and the exposed lip 326 may be selected to manage the amount of compressive forces placed on a panel 300 as well as to reduce the amount of unwanted pin point loads that may be developed at or near the edges of the securement area 321. In other words, the securement area 321 may be selected during design to allow for a large enough total overall compressive force to be applied for securement of the clamp and the cable to the panel 300 but to also satisfy a PSI compressive force tolerance of the panel 300 for the cable being secured.

Break away sections may be present in the securement area to allow for adjustment of the size or shape of the securement area 321. These break away sections may comprise scored lines spaced at various distances apart in the securement area 321. By breaking away a scored section of the securement area 321, the amount of total securement force may remain the same and the PSI exerted on the solar panel may increase.

Figure 4:
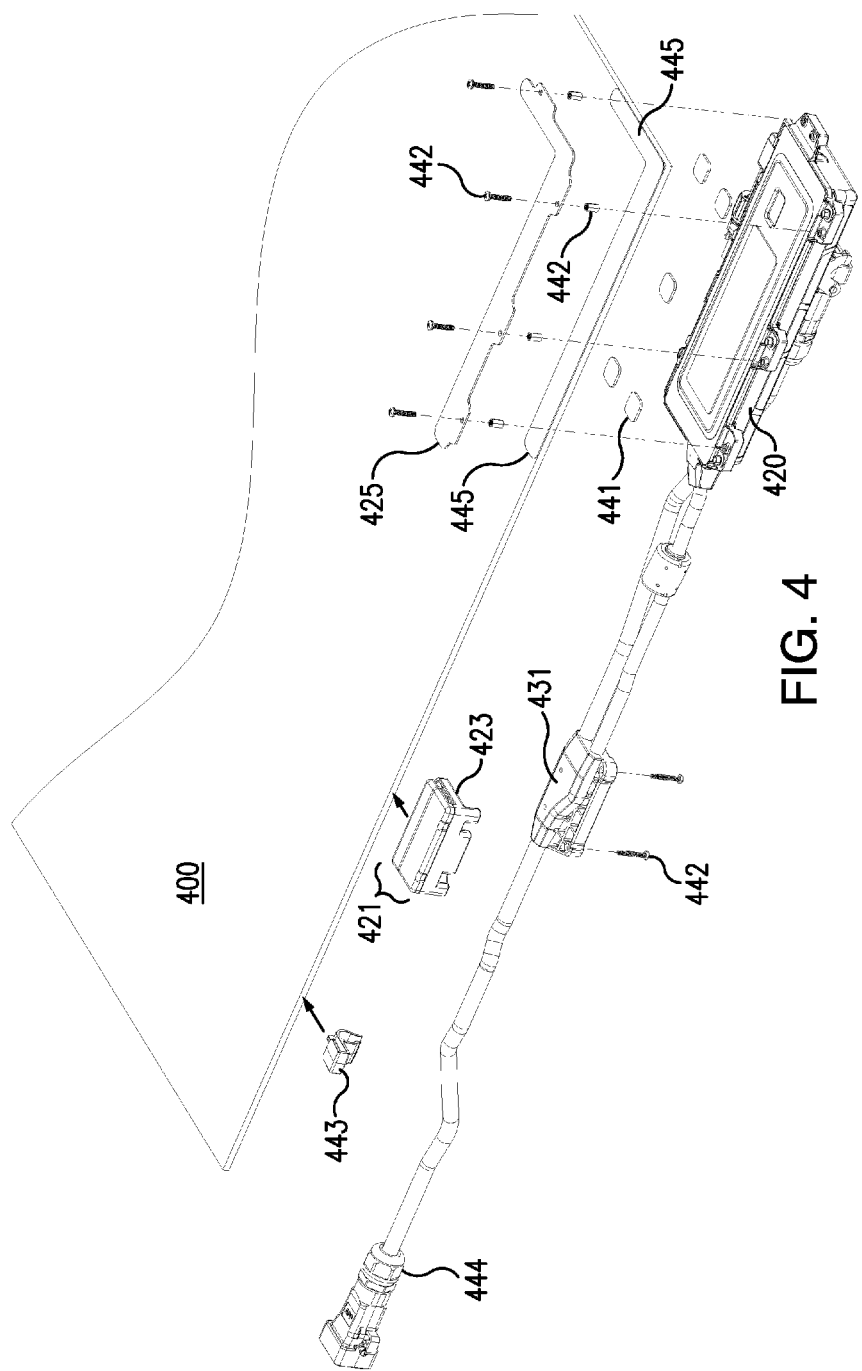
FIG. 4 shows an exploded perspective view of a micro-inverter assembly, a primary metallic clamp, a mid-cable junction clamp, a tertiary clamp, and a portion of a frameless solar panel, in accord with embodiments.

FIG. 4 shows an exploded view of a section of a frameless solar panel 400 and various components that may be secured to the solar panel 400. Visible in FIG. 4 are the frameless solar panel 400, the micro-inverter 420, stainless steel hardware (screws and spacers) 442, a connector 444, a tertiary cable clip 443, a mid-cable junction clamp securing area 421, a mid-cable junction clamp 423, a mid-cable junction 431, Ethylene Propylene Diene Monomer (EPDM) spacers 441, a metal L top clamp 425, and topside EPDM spacer/friction strip 445. The stainless steel hardware 442 shown includes screws as well as spacer collars. These collars may be configured such that they provide an audible warning or visible warning, such as, but not limited to, a click or color change when compressive forces being applied by the screw approach a compressive force threshold of the solar panel. Also, in embodiments, the spacer collars may provide a mechanical stop to prevent over compression. Likewise, the clamp may also provide mechanical stops in embodiments as well.

As can be seen in FIG. 4, the stainless steel hardware 442 from the metal clamp 425 of the micro inverter 420, is positioned just outside the edge of the frameless solar panel 400. During assembly, the tertiary cable clamp 443 and the mid-cable junction clamp 423 may be slid over an edge of the frameless solar panel 400 prior to securing the components and cabling to the clamps 443 and 423. In so doing, proper compressive forces and tensions may be applied to secure the clamps to the solar panel. This process may be different or even reversed as well, with the clamps first being secured to some or all of the micro-inverter assembly components before securing the clamps to the solar panel. In this or other embodiments a gap of, for example, 5 mm when the panel thickness is 3 mm, may be left in the bracket before it is slid over the solar panel edge and then securement forces may be applied to remove the gap and secure the clamps to the solar panel. In embodiments, the EPDM spacers may occupy a portion of this gap and may be, for example, 2 mm in thickness. These spacers may serve to provide frictional temporary forces to hold the clamps in place during securement. Other thicknesses and gaps may be used as well in embodiments.

Figure 5:
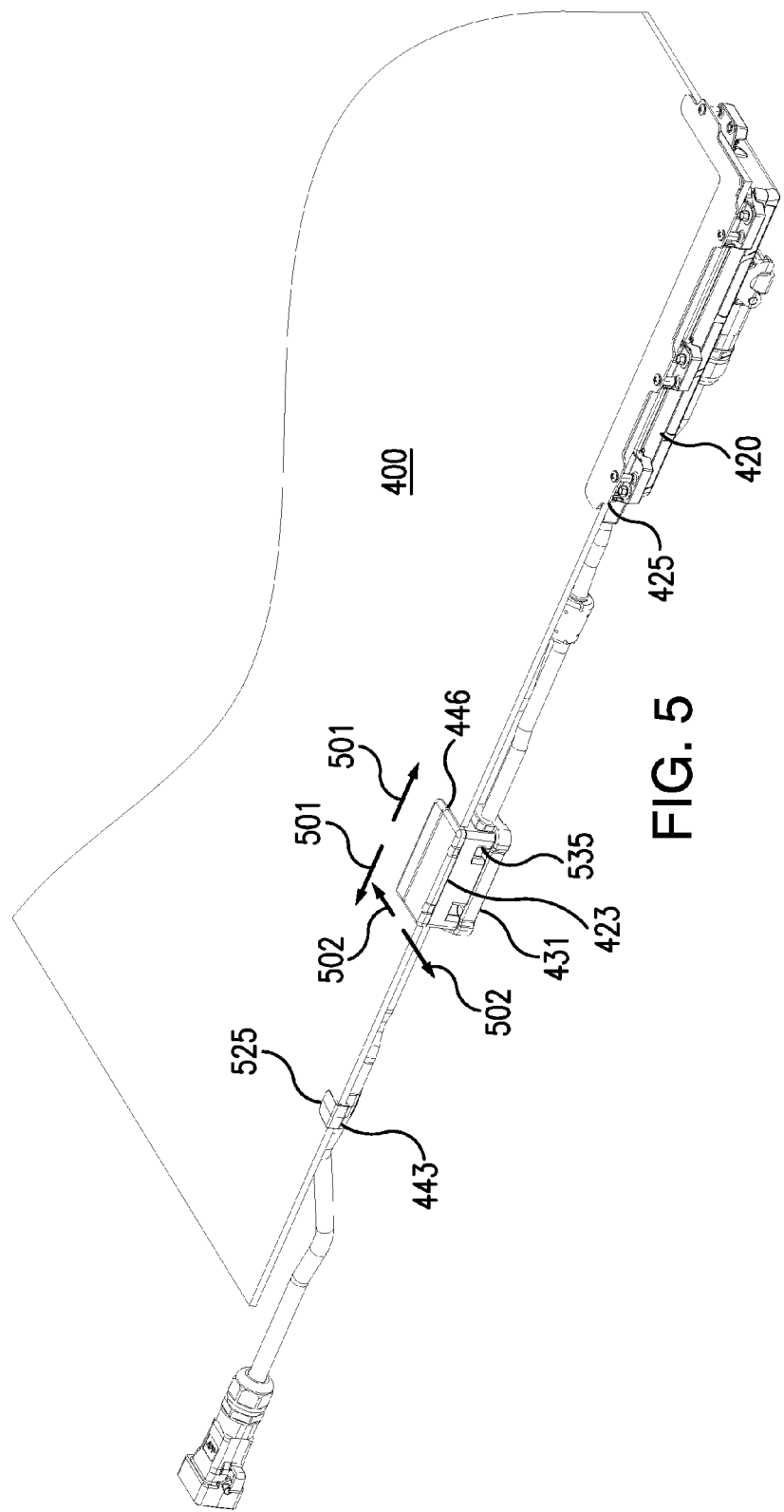
FIG. 5 shows a perspective sectional front view of the frameless solar panel with the micro-inverter assembly of FIG. 4 mounted in accord with embodiments.

FIG. 5 shows a micro-inverter assembly coupled to the frameless solar panel 400 using various clamps in accord with embodiments. As can be seen, the face of the frameless solar panel 400 has portions of the cable clamp 443, the mid-cable junction clamp 423, and the metal bracket frameless panel clamp 425, on its upper face, while the inverter assembly components are positioned on the opposite, lower face. Visible in FIG. 5 are the frameless solar panel 400, the tertiary cable clamp 443, the mid-cable junction 431, the mid-cable junction clamp 423, the metal bracket frameless panel clamp 425, friction strip 446, securement access 535, and the micro-inverter 420. As is also noticeable in FIG. 5, when the micro-inverter assembly is secured to the frameless solar panel, a final connector may be routed to and beneath the solar panel. In other embodiments, as is shown in FIG. 5, a connector may also extend beyond the solar panel to connect the micro-inverter assembly to an outside system or circuit. The position of the connector may depend upon the final installation logistics and orientation of the solar panel in the field installation. The friction strip 446 may serve to prevent slippage of the clamp 423 in the lateral direction shown by arrows 501. The friction strip may also serve to prevent slippage in the perpendicular direction shown by arrows 502. The securement access may provide an opening through which a means for generating or exerting securing forces, such as a cam or pawl, ratchet, threaded screw, or spring system can be activated or put in place to provide compressive forces for the mid-cable junction clamp 423.

FIG. 6 shows the reverse side of the solar panel of FIG. 5, with the inverter assembly attached. In addition to the components identified in FIG. 5, FIG. 6 also shows a junction box 551. This junction box 551 may be positioned in various locations on a solar panel and may be a primary point of electrical and mechanical connection between the micro-inverter assembly and the actual photovoltaic collectors of the solar panel 400.

Figure 7:
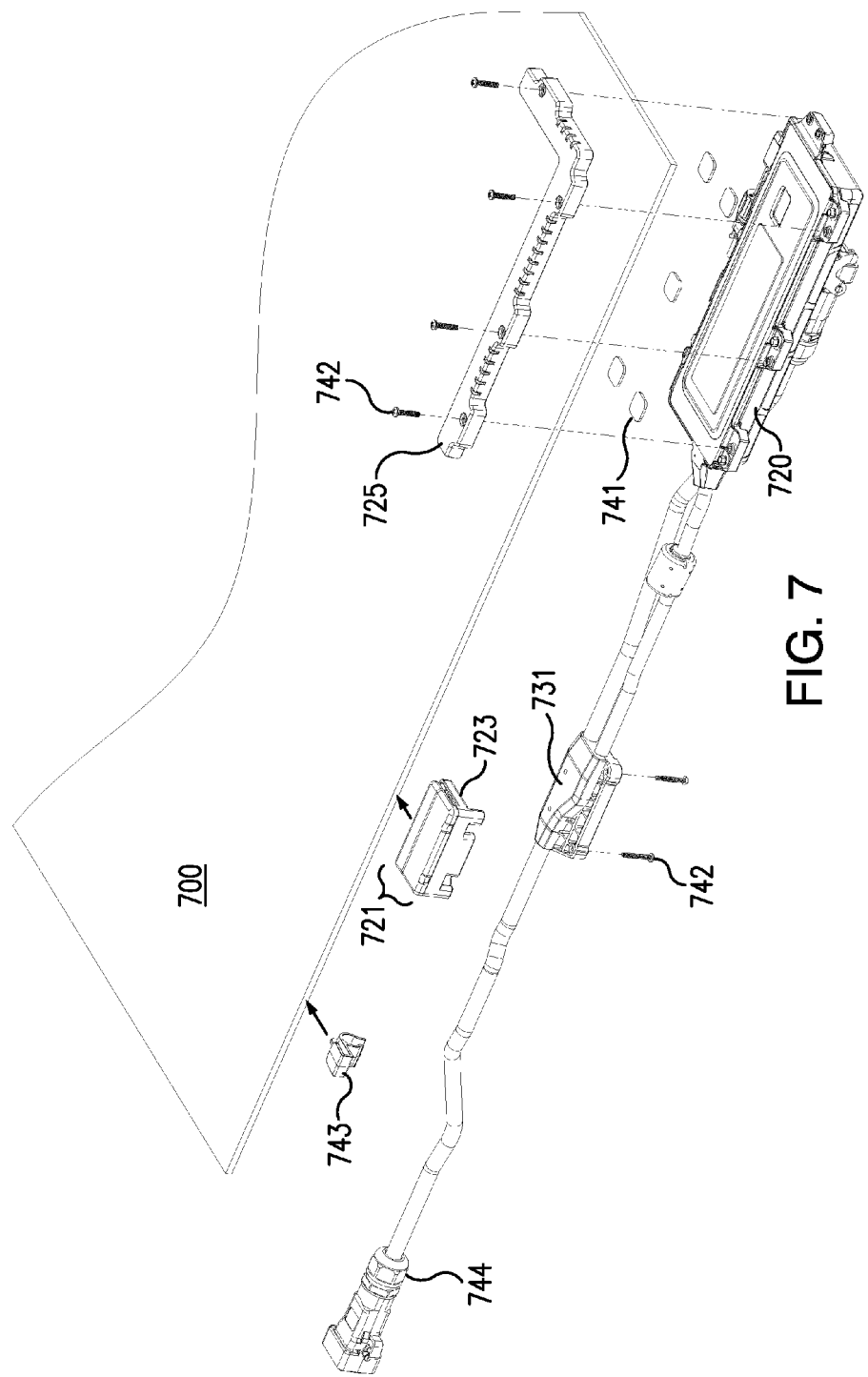
FIG. 7 shows an exploded perspective view of a micro-inverter assembly, a primary polymer clamp, a mid-cable junction clamp, a tertiary clamp, and a portion of a frameless solar panel, in accord with embodiments.

FIG. 7 shows an exploded view of a micro-inverter assembly and frameless solar panel much like that from FIG. 4. A notable difference is that the clamps are each made of a resin material rather than a steel or other metal alloy material, as is shown in FIG. 4. As can be seen in FIG. 7, the L-shaped clamp top has a higher profile that the metal clamp of FIG. 4 and has various support ridges along its length, unlike the metal clamp shown in FIG. 4. These ridges may provide resistance to torsional forces applied to the clamp and may provide reinforcement in other orientations as well. The ridges or reinforcements may also run along the length of the clamp in addition to being perpendicular to the length, or instead of this orientation. The orientation of the ridges may be aligned in different positions as well.

Figure 12A:
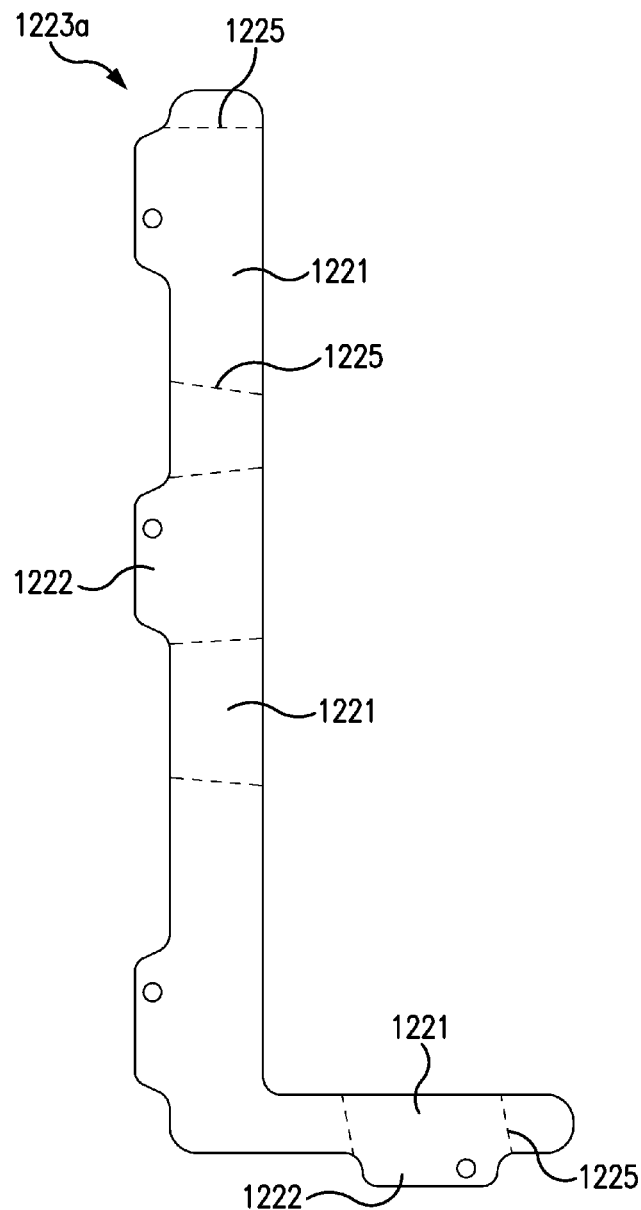
FIGS. 12a-12b shows top and side views of a primary metallic clamp in accord with embodiments.

FIG. 7 includes a frameless solar panel 700, stainless steel hardware 742, clamp 723, clamp 725, EPDM spacer 741, micro-inverter 720, mid-cable junction 731, cable clip 743, and connector 744. As above, the connector 744 along with the mid-cable junction 731, and the micro-inverter 720, comprise the micro-inverter assembly. In embodiments, the micro inverter assembly may include the same, fewer, or more components as well. As with earlier discussions, compressive forces may also be managed while applying securing pressures in the clamp 723. Management of compressive forces may be managed via sensing systems, as discussed elsewhere herein, or by, as additional examples, breakaway areas specifically designed to fail prior to reaching tolerances of the frameless solar panel. These breakaways or other components can take on various configurations and include the scores shown on FIG. 12a. The clamps may also include mechanical stops to prevent over compression. These stops may be included with the hardware 742 and may comprise a polymer, such as rubber, to provide a flexible and resilient stop.

Figure 8:
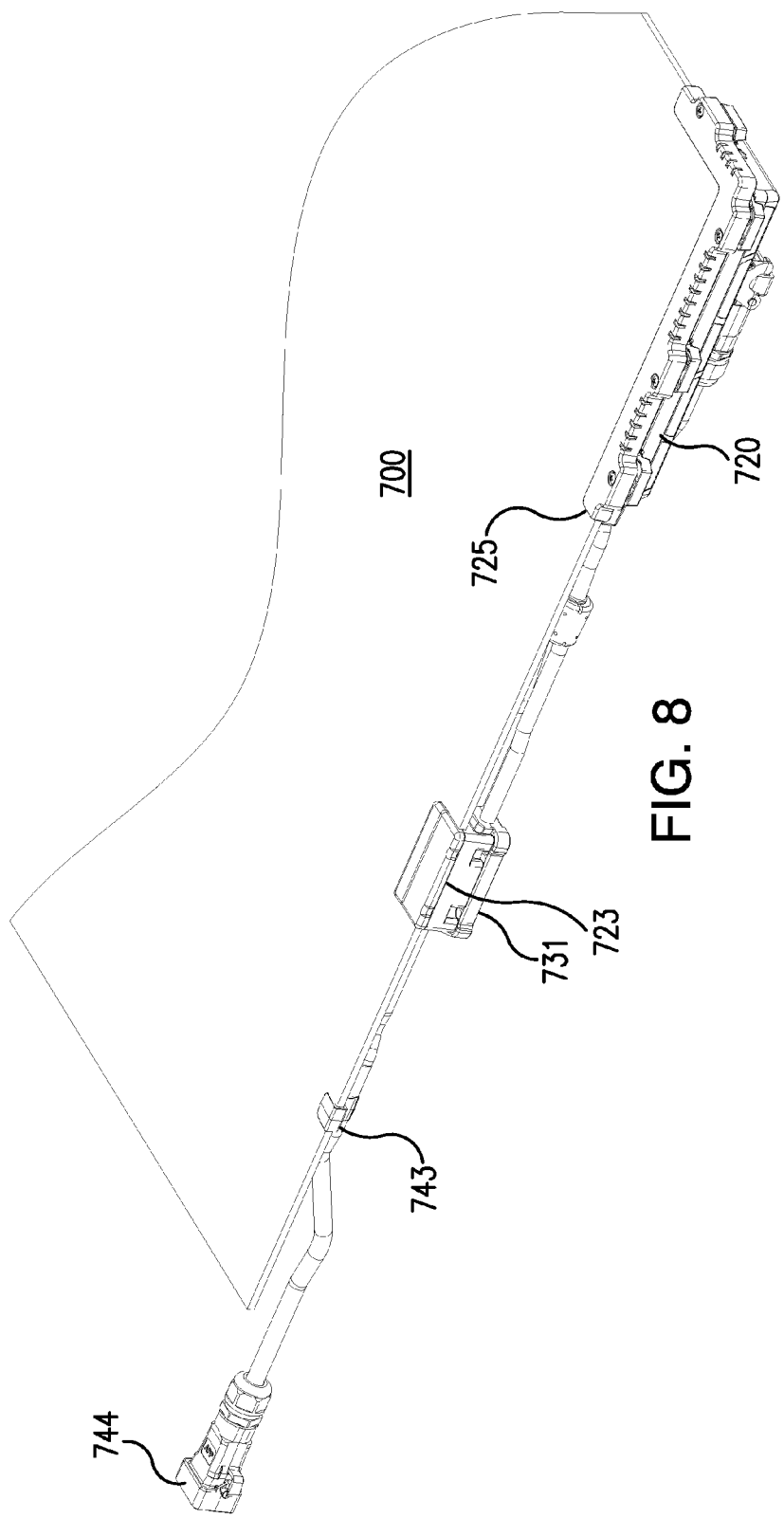
FIG. 8 shows a perspective sectional front view of the frameless solar panel and micro-inverter assembly of FIG. 7 in accord with embodiments.

FIG. 8 shows a micro-inverter assembly attached to a bottom edge of the frameless solar panel 700. As can be seen, the top surface of the solar panel 700 has primary clamp 725, mid-cable clamp 723, and tertiary clamp 743 extending over and onto the top surface. On the reverse surface, the micro-inverter 720, mid-cable junction 731, and the remaining portions of the cable are positioned and secured.

Figure 9:
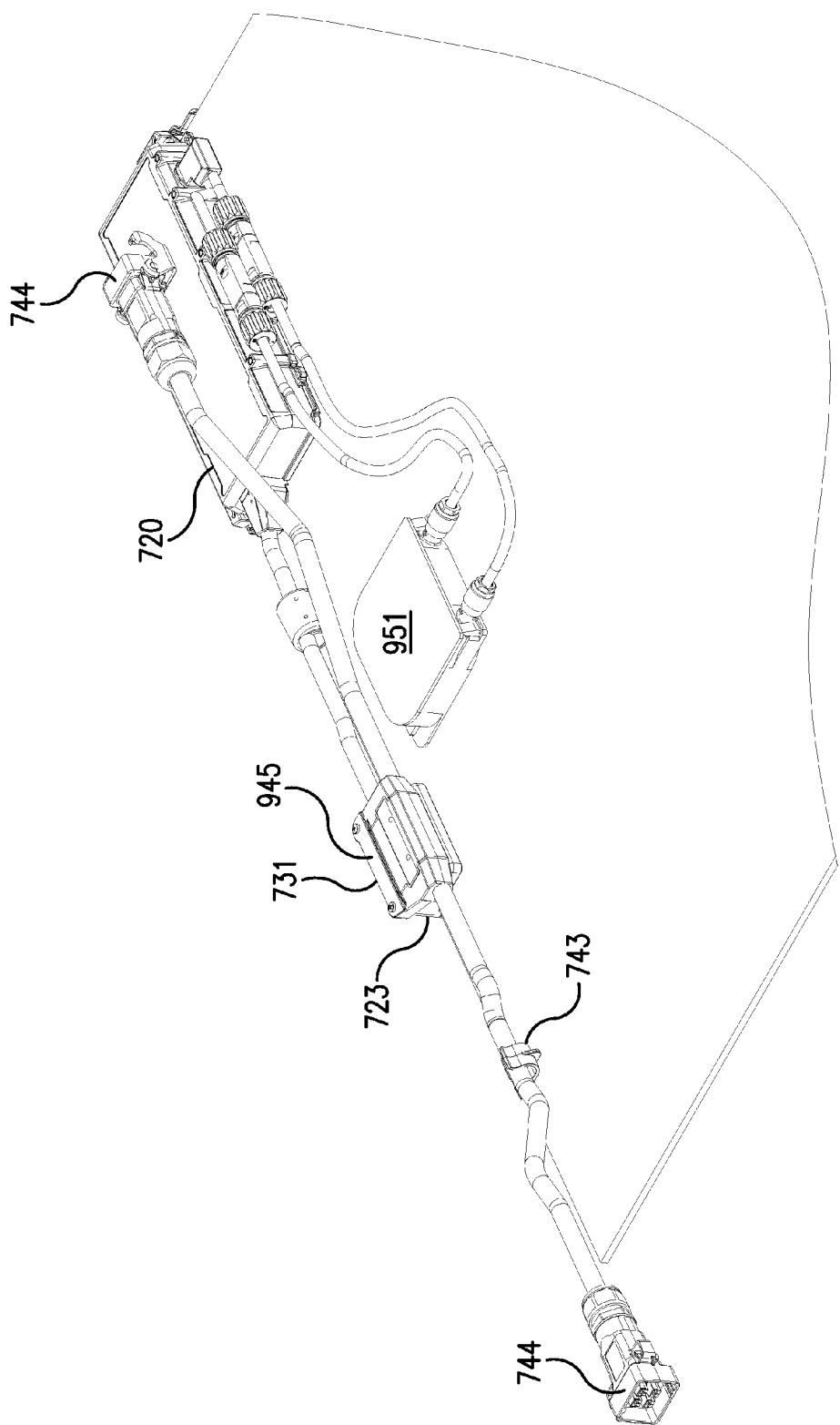
FIG. 9 shows a perspective sectional back view of the frameless solar panel and micro-inverter assembly of FIG. 7 in accord with embodiments.

FIG. 9 is similar to FIG. 6 in mounting details and discussion. FIG. 9 shows a connector 744, a micro-inverter 720, a junction box 951, a mid-cable junction 731 having a compression bar 945, a mid-cable junction clamp 723, a tertiary cable clamp 743, and an additional connector 744. Also visible in FIG. 9 is the edge of the frameless solar panel.

Figures 10A, 10B:
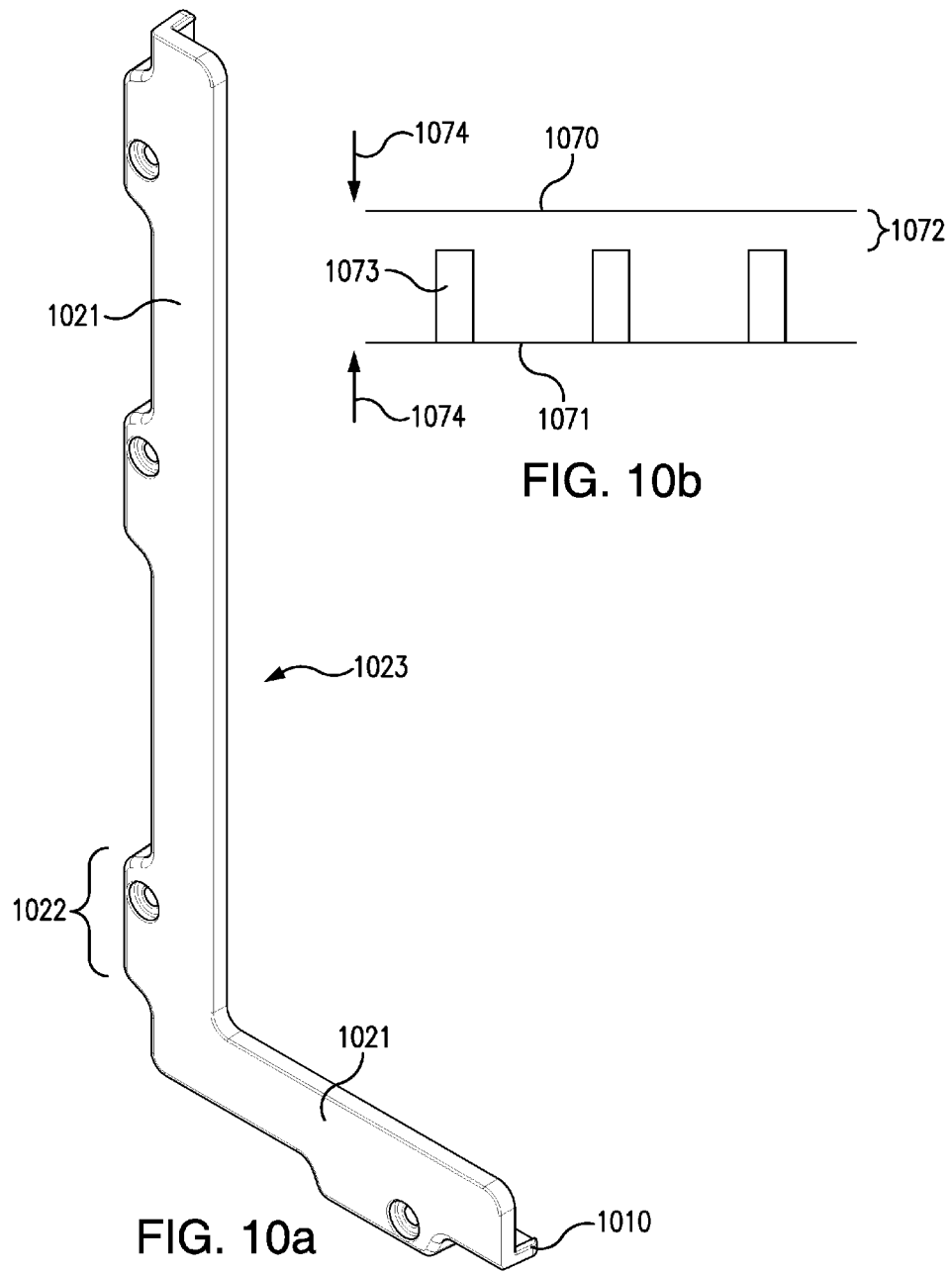
FIG. 10a shows a perspective view of a primary polymer mounting clamp in accord with embodiments.
FIG. 10b shows a side-view of a deflection zone as may be employed by a clamp in embodiments.
Figure 11C:
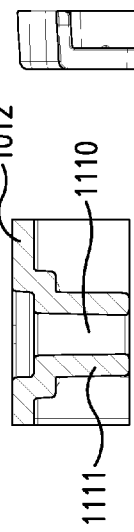
Figure 11D:
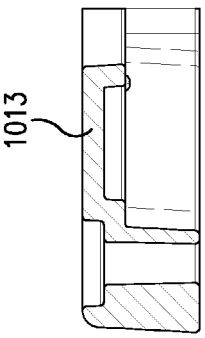
Figure 11E:
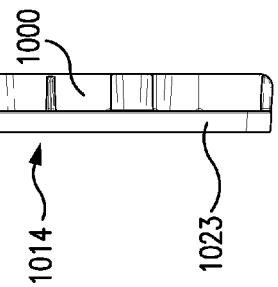
Figure 11F:
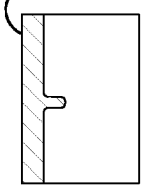
Figure 11G:
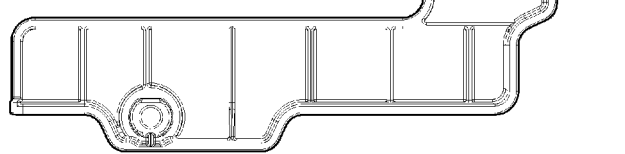

FIG. 10a shows a perspective view of a top L clamp 1023 as may be employed in embodiments. Visible in FIG. 10a are the secured areas 1022, L overhang 1010, and a securing area 1021. Consistent with the above, as screws or other secure devices are placed through the securing area, clamping force will be applied across the entire body of the clamp.

FIG. 10b shows a deflection zone as may be employed in various embodiments. These deflection zones may be used in clamps to monitor the compressive forces exerted by the clamp. The posts 173 may move towards a surface 1070 to show that the limit of deflection 1072 has been reached or is approaching. In other words, the force needed to move the posts 1073 to a surface 1070 indicates that a certain force has been applied to the clamp and is being applied by the clamp to a panel to which the clamp is secured.

FIG. 11 shows top side and bottom side views of polymer L clamp as may be employed in embodiments. The top side of the clamp is shown at 1023a, the other side is shown at 1023b, and a bottom view is shown at 1023c. As can be seen in 1023c, the polymer is reinforced with ribs along its length for structural support. These ribs are shown at 1011, section B-B. Section AA, at 1013, shows how a recess may be formed along the length of the clamp. A cushion, such as an EPDM spacer, may be placed along the length as well. The top side EPDM spacer 445, of FIG. 4, is such an example. The sectional view C-C shows how the screw channel 1110 may have a wall 1111. This wall may serve as a safety. This wall may be designed with a compression zone that can withstand a certain compression tolerance and may then send an audible or visual signal when this compression tolerance is reached or exceeded. The signal may include a visible deflection, a change in color, a cracking or popping or clicking sound, and other variations of audible or visual indicators. The indicator signal may be created through the use of variable materials in the walls or by using a variable cross-sectional thickness in the wall with a sacrificial area, or through other configurations and methods as well.

Figure 12B:
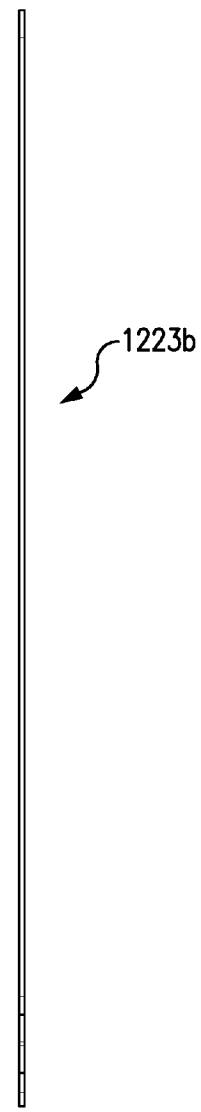

FIG. 12 shows a top and side view of the metal clamp as may be employed in embodiments. The top side is visible at 1223 and the side view is visible at 1223b. The securing area 1221 is shown along with the clamping force 1222. The securing area 1221 may be applying uniform compressive forces when used for securement and may provide nonuniform forces as well. As can be seen in FIG. 12, the L clamp has a substantially uniform width across the entire length of the L clamp. In embodiments, the clamp may have different widths and lengths and may be configured to secure to certain specific solar panels. The L clamp may also have scores 1225 across the clamp that may be used to change the length of the clamp by creating bend points for easily fatiguing the metal and snapping unwanted lengths of the clamp away from it during in-situ field installation. In other words, should the clamp be sized to fit several sizes of panel, the clamp may be reduced in size for a certain panel by removing a portion of the clamp prior to installation. As can be seen, the scores 1225 may have various orientations.

Figure 13:
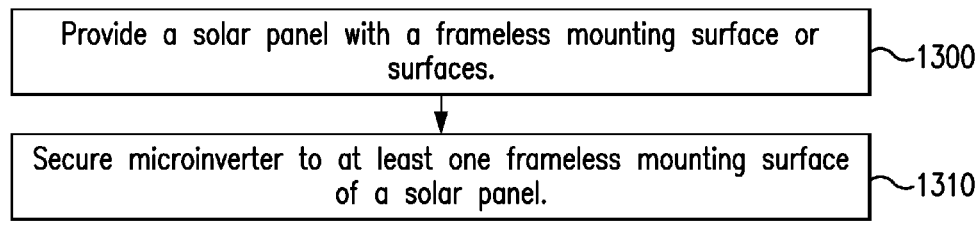
FIG. 13 shows a process in accord with embodiments.

FIG. 13 provides a method as may be employed in embodiments. These actions of the method may be performed with others, and in this or various other orders. They may also be performed as described or with more are fewer steps or considerations as well as with more or different considerations. As shown in FIG. 13, 1300, a solar panel may be provided with a frameless mounting surface or surfaces. As shown at 1310, a micro-inverter assembly may be secured to a frameless mounting surface of the solar panel. The micro-inverter assembly may be previously configured to mount on a frame surrounding the solar panel. Thus, in embodiments an adaptive clamp may be designed or adapted after design to use the existing securement points of the micro-inverter assembly when securing the assembly to a frameless solar panel. This adaptation or design may include adding safeties to the clamp to provide warning or signals when compressive tolerances of the solar panel are being reached. This adaptation or design may also include providing securements that are permanent and can be secured and unsecured. The securements that can be secured and unsecured include those shown in FIGS. 15a-15c, as well as others. The permanent securements can include adhesives such as glues and epoxies. When permanent securements are used it is preferred that the coefficients of thermal expansion for the adhesive, the securement, and the solar panel be matched or fall within their range of tolerances such as to avoid placing failure stresses generated by thermal expansion and contraction on the solar panel. To further account for thermal expansion and contraction securement points can be spaced apart from one another along the lengths of the assembly and the solar panel.

Figure 14:
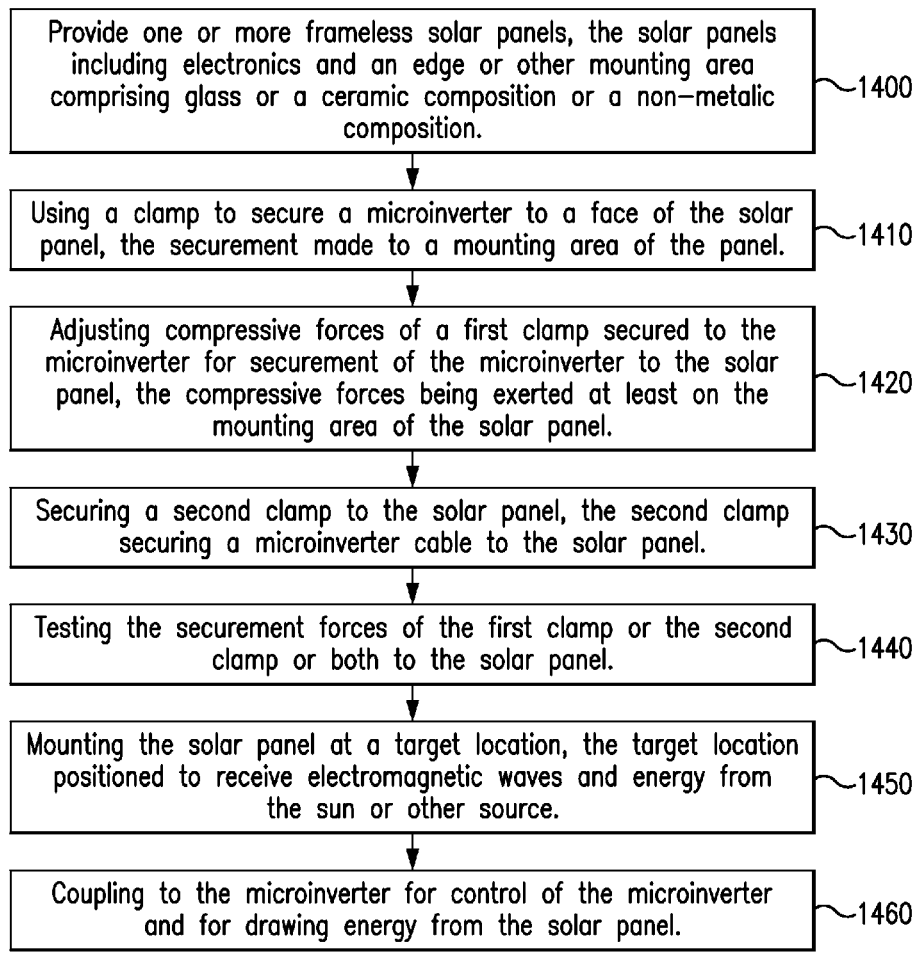
FIG. 14 shows a process in accord with embodiments.

FIG. 14 also provides a method in accord with embodiments. As noted above, the actions described in FIG. 14 may be performed in this order, in other orders, and with more, fewer or the same number of steps, processes, or considerations. Shown in FIG. 14, as 1400, is that one or more frameless solar panels may be provided wherein the solar panels include panel collectors and have an edge or other mounting area that comprises glass or ceramic composition or non-metallic composition. As shown in 1410, an adaptive clamp may be used to secure a micro-inverter to a face, such as the shade side, of the solar panel by securing the adaptive clamp to the mounting area of the panel. As shown in 1420, compressive forces may be adjusted on this first adaptive clamp in order to secure the adaptive clamp to the mounting area. As shown in 1430, a second adaptive clamp may be secured to the solar panel, wherein the second clamp may be used to secure a micro-inverter cable to the solar panel. As to 1440, testing may be performed on the assembly and the securement. This may include testing the securing forces of the adaptive clamps on the solar panel as well as testing the compressive forces being placed on the solar panel. This testing can be targeted to provide for securement forces that are large enough to prevent unwanted disassembly between the micro-inverter and the solar panel while at the same time serving to retard cracking or other damage to the solar panel at installation, as well as during lifetime use. Step 1450 of FIG. 14 provides for mounting the solar panel at a target location and step 1460 shows connecting the micro-inverter for control and for drawing energy from the solar panel.

FIG. 15 shows various means that may be used to apply securement forces by an adaptive clamp to secure a micro-inverter assembly, or a component of it, to a solar panel without the necessity of a frame. FIG. 15*a* shows a ratchet and pawl system 1500 that serves to extend an arm 1542 towards a surface 1540 in order to apply securement forces to the surface. This ratchet and pawl system may also be geared to move the arm 1542 downward instead. Shown in FIG. 15*a* are the arm 1542, surface 1540, ratchet stop 1530, pawl 1510, central axis 1525, arrow of possible rotation 1552, and arrows of possible linear movement 1520 and 1542. The surface 1540 may be a surface of a solar panel or other surface to which securement forces from a clamp may be applied for securement purposes. In embodiments, this surface may be an edge of a solar panel where there is little or no interference with photovoltaics on the solar panel.

FIG. 15*b* shows a cam 1544 and lever 1543 that may be used to generate and apply securement forces for a clamp employed in embodiments. The lever 1543 and cam 1544 may move in the direction of arrow 1580 and may apply upward forces on the block 1581, which may in turn apply securement forces to surface 1540. The cam and lever may also apply forces to surface 1545 of the clamp.

FIG. 15*c* shows how a threaded post 1561 may be used to apply securement forces to a surface 1540 of a solar panel. This threaded post may be oriented and positioned such that as the post is rotated and extends outwardly from a threaded receiver 1560 of a block 1570, securement forces may be placed in the direction of arrows 1571. The clamp surface 1545 and extension distance 1550 are also labeled in FIG. 15*c*. Each of the above securement compression means may be used in various combinations in embodiments. This includes using a single type of means described herein as well as using various and mixed types of means described herein.

As discussed above various changes and redesigns are possible in the various embodiments and teachings provided herein. For example, various resins or polymers may be used for the clamps described herein. An example of such a resin may include the Asahi Kasei Chemicals Corporation Xyron® 540Z modified Polyphenylene Ether. Similarly, the clamp material may comprise aluminum AL 5052-H32 type, having a thickness of 1.5 mm and a temper hardness of H32, other thicknesses and hardnesses may be used in embodiments as well. In preferred embodiments torque tightening values may fall in a range of 5.9 to 6.6 ft-lbs of torque (about 8-9 N-m) to reduce the likely hood of breakage of the panel. Also, torque values in embodiments should not exceed 7.37 ft-lbs of torque (10 N-m) to avoid breakage of the panels.

The terminology used herein is for the purpose of describing particular embodiments only and is not intended to be limiting of the invention. As used herein, the singular forms "a," "an" and "the" are intended to include plural forms as well, unless the context clearly indicates otherwise. Likewise "clamp" as used throughout may also mean and can also be understood to mean "adaptive clamp" and vice-versa. It will be further understood that the terms "comprises" and/or "comprising," when used in this specification, specific the presence of stated features, integers, steps, operations, elements, and/or components, but do not preclude the presence or addition of one or more other features, integers, steps, operation, elements, components, and/or groups thereof.

The corresponding structures, material, acts, and equivalents of all means or steps plus function elements in the claims below are intended to include any structure, material or act for performing the function in combination with other claimed elements are specifically claimed. The description of the present invention has been presented for purposes of illustration and description, but is not intended to be exhaustive or limited to the invention in the form disclosed. Many modifications and variations will be apparent to those of ordinary skill without departing from the scope and spirit of the invention. The embodiment was chosen and described in order to best explain the principles of the invention and the practical application, and to enable others of ordinary skill in the art to understand the invention for embodiments with various modifications as are suited to the particular use contemplated.

The invention claimed is:

1. A method for securing a micro-inverter to a solar panel, the method comprising:
   gathering a first solar panel, a micro-inverter, and a first adaptive clamp,
      the first solar panel comprising a front surface and a back surface, the front surface comprising a plurality of photovoltaic collectors, the first solar panel further comprising a frameless mounting area,
      the micro-inverter configured with one or more securements for mounting the micro-inverter to a frame surrounding a second solar panel,
      the first adaptive clamp configured for coupling to one or more securements of the micro-inverter and further configured to apply a compressive force to the front surface of the first solar panel and a compressive force to the back surface of the first solar panel;
   securing the first adaptive clamp to one or more securements of the micro-inverter; and
   securing the first adaptive clamp to the frameless mounting area of the first solar panel.

2. The method of claim 1 wherein the first adaptive clamp includes a friction zone positioned on the clamp to apply resistance to sliding between the first adaptive clamp and the frameless mounting area of the first solar panel when the first adaptive clamp is positioned about the frameless mounting area of the first solar panel and before securement of the first adaptive clamp to the frameless mounting area of the first solar panel.

3. The method of claim 1 wherein the first solar panel is a frameless solar panel and the second solar panel has a frame for mounting the micro-inverter primary and further comprising
   securing a mid-cable junction clamp to a mid-cable junction connected to the micro-inverter and securing the mid-cable junction clamp to a second frameless mounting area of the first solar panel;
   securing a tertiary adaptive clamp to a cable connected to the mid-cable junction and securing the tertiary adaptive clamp to a third frameless mounting area of the first solar panel,
   wherein securing the mid-cable junction clamp and the tertiary adaptive clamp includes applying opposing compressive forces to surfaces of the first solar panel.

4. The method of claim 1 wherein the first adaptive clamp is L shaped and includes a similarly shaped cushion spacer.

5. The method of claim 1 wherein the mid-cable junction clamp includes one or more means for exerting securing forces on the first solar panel.

6. A system for securing a micro-inverter to a frameless solar panel, the system comprising:

a micro-inverter configured to be mounted on a frame supporting or surrounding a solar panel, the micro-inverter having a plurality of fastening points configured to secure the micro-inverter to the frame supporting or surrounding the solar panel;

a primary clamp in the shape of an "L" comprising a plurality of securement areas that each coincide with one or more fastening point of the micro-inverter; and a first compression spacer, a second compression spacer, and a third spacer;

wherein, when the primary clamp and the micro-inverter are coupled to each other and secured to a solar panel having a thickness, wherein the third spacer is positioned and configured to maintain a distance between the primary clamp and the micro-inverter clamp, the distance associated with the thickness of the solar panel, and wherein the first compression spacer and the second compression spacer are positioned between the primary clamp and the micro-inverter and are spaced apart from each other and separated by a solar panel.

7. The system of claim 6 wherein the first compression spacer is "L" shaped, the third spacer is a tube, and the first compression spacer and the second compression spacer comprise EPDM.

8. The system of claim 6 wherein there are four securement areas on the primary clamp.

9. The system of claim 6 further comprising:
a mid-cable junction clamp and a tertiary clamp, the mid-cable junction clamp including
a means for exerting securing forces on the solar panel.

10. The system of claim 9 wherein the mid-cable junction clamp further comprises one or more break away sections on an exposed securement area and a safety, the safety configured to provide a visual or audible alarm when compressive forces exerted by the mid-cable junction on the solar panel reach or exceed a compressive pressure threshold.

11. The system of claim 9 wherein the mid-cable junction clamp includes a friction zone, the friction zone providing enhanced opposition to sliding between the mid-cable junction clamp and the solar panel before the mid-cable junction clamp is secured to the solar panel.

12. A frameless solar panel comprising:
a front surface and a back surface, the back surface opposite the front surface, the front surface comprising photovoltaic collectors;
a micro-inverter assembly comprising a micro-inverter, a mid-cable junction, cable, and a connector; and
a primary clamp, a mid-cable junction clamp, and a tertiary clamp,
wherein the primary clamp is secured to the micro-inverter, the mid-cable junction clamp is secured to the mid-cable junction, and the tertiary clamp is secured to the cable,
wherein the primary clamp exerts compressive forces on the front surface of the solar panel and the micro-inverter exerts opposing compressive forces on the back surface of the solar panel, these compressive forces serving to secure the clamp and the micro-inverter to a first frameless portion of the solar panel, and
wherein the mid-cable junction clamp is secured to the mid-cable junction and wherein the mid-cable junction clamp is compressively secured to a second frameless portion of the solar panel using a means for exerting securing forces.

13. The frameless solar panel of claim 12 wherein the tertiary clamp is secured to the cable and is compressively secured to a third frameless portion of the solar panel and wherein the primary clamp is scored to provide for breaking portions of the primary clamp away and adjusting its overall size.

14. The frameless solar panel of claim 12 wherein the primary clamp, when secured to the front surface, has an intervening compression spacer between the clamp and the front surface of the solar panel and wherein the primary clamp includes a deflection zone, the deflection zone configured to deflect when a target compressive force is reached or exceeded.

15. The frameless solar panel of claim 12 wherein the primary clamp is L shaped.

16. The frameless solar panel of claim 12 wherein the mid-cable junction clamp includes a friction zone, a gap for receiving an edge of the solar panel, and a securement area having a trapezoidal shape.

* * * * *